(12) United States Patent
Zia et al.

(10) Patent No.: US 7,514,313 B2
(45) Date of Patent: Apr. 7, 2009

(54) PROCESS OF FORMING AN ELECTRONIC DEVICE INCLUDING A SEED LAYER AND A SEMICONDUCTOR LAYER SELECTIVELY FORMED OVER THE SEED LAYER

(75) Inventors: Omar Zia, Austin, TX (US); Da Zhang, Austin, TX (US); Venkat R. Kolagunta, Austin, TX (US); Narayanan C. Ramani, Austin, TX (US); Bich-Yen Nguyen, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 220 days.

(21) Appl. No.: 11/400,945

(22) Filed: Apr. 10, 2006

(65) Prior Publication Data
US 2007/0235813 A1 Oct. 11, 2007

(51) Int. Cl.
*H01L 21/98* (2006.01)
*H01L 21/8238* (2006.01)

(52) U.S. Cl. ................... 438/218; 438/142; 438/196; 438/211; 257/351; 257/69; 257/374; 257/E21.632; 257/E21.633

(58) Field of Classification Search ................ 438/199, 438/300, 196, 218, 221; 257/351, 369, 374
See application file for complete search history.

(56) References Cited

U.S. PATENT DOCUMENTS

| 4,686,000 | A  | * | 8/1987 | Heath ........................ 438/702 |
| 5,767,549 | A  | * | 6/1998 | Chen et al. ................... 257/347 |
| 6,621,131 | B2 | * | 9/2003 | Murthy et al. ............... 257/408 |
| 2005/0133832 | A1 | | 6/2005 | Murthy et al. |
| 2005/0133932 | A1 | | 6/2005 | Pohl et al. |
| 2008/0096343 | A1 | * | 4/2008 | Chou et al. .................. 438/218 |
| 2008/0179684 | A1 | * | 7/2008 | Liang et al. .................. 257/369 |
| 2008/0182370 | A1 | * | 7/2008 | Peidous et al. ............... 438/199 |

OTHER PUBLICATIONS

Wolf, S.; "Microchip Manufacturing"; 2004; Lattice Press; pp. 51-70.*
Quirk, M. and Serda, J.; "Semiconductor Manufacturing Technology"; 2001; Prentice-Hall, Inc. pp. 435-441.*
Ghani, T. et al., "A 90nm High Volume Manufacturing Logic Technology Featuring Novel 45nm Gate Length Strained Silicon CMOS Transistors," IDEM Tech. Dig., pp. 978-980, 2003.
Loo, R. et al., "A Successful Selective Epitaxial Si(1-x)Ge(x) Deposition Process for HBT-BiCMOS and High-Mobility Heterojunction pMOS Applications," Yield Management Solutions, Summer 2004, www.kla-tencor.com/magazine, pp. 64-68.

* cited by examiner

*Primary Examiner*—Dao H Nguyen

(57) ABSTRACT

A process of forming an electronic device can include forming an insulating layer over first and second active regions, and a field isolation region. The process can also include forming a seed layer and exposing the first active region. The process can further include selectively forming a first and second semiconductor layer over the first active region and the seed layer, respectively. The first and second semiconductor layers can be spaced-apart from each other. In one aspect, the process can include selectively forming the first and second semiconductor layers simultaneously at a substantially same point in time. In another aspect, an electronic device can include first and second transistor structures separated by a field isolation region and electrically connected by a conductive member. A semiconductor island, designed to be electrically floating, can lie between the conductive member and the base layer.

20 Claims, 4 Drawing Sheets

PROCESS OF FORMING AN ELECTRONIC DEVICE INCLUDING A SEED LAYER AND A SEMICONDUCTOR LAYER SELECTIVELY FORMED OVER THE SEED LAYER

BACKGROUND

1. Field of the Disclosure

The present disclosure relates to electronic devices and processes for forming electronic devices and, more particularly, to electronic devices including selectively formed layers.

2. Description of the Related Art

Successful manufacturing of semiconductor devices can depend in part on the precision with which patterned layers can be located during the manufacturing process. Blanket formation of a layer followed by lithography and etch is one method that can be used. However, precise location using a physical alignment mark may prove challenging with thick or opaque layers.

One proposed method is to use a process that will deposit or grow material only where a specific material is exposed on the surface of a workpiece. Such a selective process can form a layer according to an exposed pattern the specific material without the subsequent use of lithography. However, the growth of an individual feature using such a process can be sensitive to the size and proximity of other features. For example, during a process, a first feature surrounded by other features can grow to a different size than a second feature of a substantially same size and shape as the first feature in an open area. To cope with this local loading, a separate formation process may need to be tailored for each layer grown.

Another method can use previously existing dummy features, such as CMP tiles to help even out the local loading during the process. A density of the dummy features that are already present can limit such a method. If the density of the dummy features is too low, exposing all of the dummy features may not adequately compensate for the process difference. If the density of the dummy features is too high, an additional lithography and etch step to uncover only those tiles that are desired may be required to avoid over compensating for the process difference.

BRIEF DESCRIPTION OF THE DRAWINGS

The present disclosure may be better understood, and its numerous features and advantages made apparent to those skilled in the art by referencing the accompanying drawings. The subject of the disclosure is illustrated by way of example and not limitation in the accompanying figures.

Figure 1:
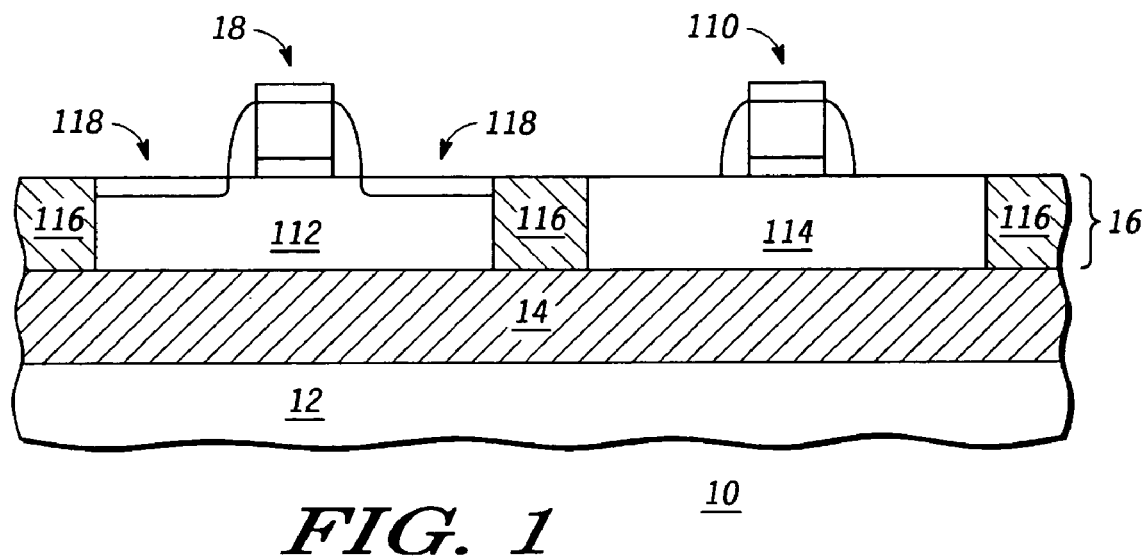
FIG. 1 includes an illustration of a cross-sectional view of a portion of a workpiece including a first transistor structure and a second transistor structure.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention. The use of the same reference symbols in different drawings indicates similar or identical items.

DETAILED DESCRIPTION

A process of forming an electronic device can include forming an insulating layer over a first active region, a second active region, and a field isolation region. The field isolation region can lie between the first active region and the second active region. The process can also include forming a seed layer over the first insulating layer and exposing the first active region. The process can further include selectively forming a first semiconductor layer over the first active region, and selectively forming a second semiconductor layer over the seed layer. The second semiconductor layer can be spaced-apart from the first semiconductor layer.

In another aspect, an electronic device can include a first transistor structure including a first source/drain region having a first semiconductor material. The electronic device can also include a second transistor structure including a second source/drain region having a second semiconductor material. The electronic device can further include a field isolation region lying between the first transistor structure and the second transistor structure. The electronic device can still further include a conductive member electrically connected to the first transistor structure, the second transistor structure, or any combination thereof. The electronic device can yet further include a semiconductor island lying between the conductive member and a base layer of the electronic device. The semiconductor island can have the first semiconductor composition. The semiconductor island can be designed to electrically float when the electronic device would be used. Specific embodiments of the present disclosure will be better understood with reference to the accompanying figures.

Some terms are defined or clarified as to their intended meaning as they are used within this specification. The term "active region" is intended to mean a portion of an electronic component through which charge carriers can flow during normal operation of the electronic component. An example of an active region can include source/drain and channel regions of a transistor structure or a resistive portion between terminals of a resistor.

The term "selective removal" or variations thereof (e.g., selectively remove, selectively removing, etc.) of one layer or material with respect to another layer or material is intended to mean that the one layer or material is removed at a significantly higher rate than the other layer or material. For example, polysilicon can be selectively removed with respect to monocrystalline silicon-germanium where the removal rate ratio is 5:1.

The term "source/drain region" is intended to include regions that are designed to function as a source, as a drain, or sometimes function as a source and at other times function as a drain of an electronic component.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

FIG. 1 includes an illustration of a cross-sectional view of a portion of a workpiece 10 in accordance with an embodiment of the present disclosure. The workpiece 10 can include a base layer 12, an insulating layer 14, and a semiconductor layer 16. The workpiece 10 can also include a transistor structure 18 and a transistor structure 110. In the illustrated embodiment, the base layer 12 can be a support layer and provide mechanical support for the other layers of the workpiece. For example, the base layer 12 can include an insulating material typically used in manufacturing semiconductor devices such as quartz, glass, plastic, or any combination thereof. In another embodiment, the base layer 12 can include a semiconductor material including a semiconductor element, such as silicon, germanium, carbon, or any combination thereof.

The insulating layer 14 can be a buried insulating layer and provide electrical insulation between the base layer 12 and the semiconductor layer 16. The insulating layer 14 can be grown, deposited, or otherwise formed by conventional or proprietary processing. The insulating layer 14 can have a thickness in a range of approximately 10 to approximately 500 nm. The insulating layer 14 can include an oxide, a nitride, an oxynitride, or any combination thereof. The semiconductor layer 16 can be grown, deposited, otherwise formed, or bonded by a conventional or proprietary technique. The semiconductor layer 16 can include a semiconductor element such as silicon, germanium, carbon, a compound semiconductor material, such as gallium arsenide, cadmium sulfide, or the like, or any combination thereof, and have a substantially uniform thickness in a range of approximately 15 to approximately 150 nm. The semiconductor layer 16 can include a p-type dopant, an n-type dopant, or any combination thereof. In one embodiment, the semiconductor layer 16 can include an active region 112 and an active region 114. In a particular embodiment, a field isolation region 116 can lie between the active region 112 and the active region 114. The active region 112 and the active region 114 can have a same or a different conductivity type.

The transistor structure 18 can include the active region 112 and the transistor structure 110 can include the active region 114. Each of the transistor structure 18 and the transistor structure 110 can be formed of conventional or proprietary materials using a conventional or proprietary process. Each of the transistor structure 18 and the transistor structure 110 can include same or different materials and be formed by a same or a different process. In one embodiment, a channel region associated with the transistor structure 18 can include a dopant of one type, and a channel region associated with the transistor structure 110 can include a dopant of another type. In a more particular embodiment, the channel region associated with the transistor structure 108 can include boron, and the channel region associated with the transistor structure 110 can include arsenic, phosphorus, or any combination thereof. In one embodiment, after formation of the transistor structure 18 and the transistor structure 110, dopant can be introduced to a doped region 118 of the transistor structure 18.

Figure 2:
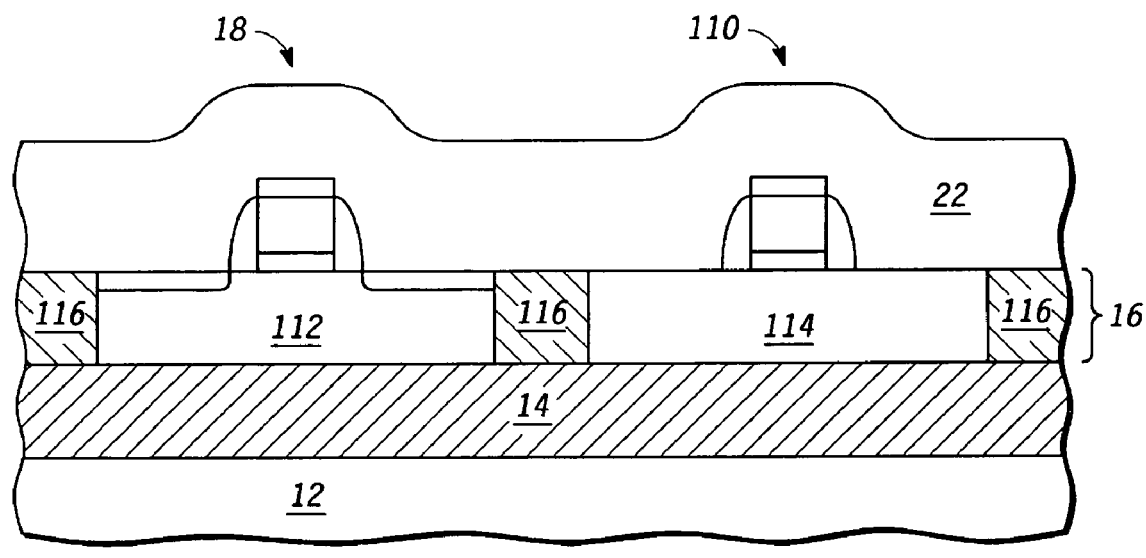
FIG. 2 includes an illustration of a cross-sectional view of the portion of the workpiece of FIG. 1 after forming an insulating layer.

FIG. 2 includes an illustration of a cross-sectional view of the workpiece 10 after forming an insulating layer 22 overlying the active region 112, the active region 114, and the field isolation region 116. The insulating layer 22 can be grown, deposited, or otherwise formed by a conventional or proprietary process and can serve as a protective layer to protect underlying features during subsequent processing. The insulating layer 22 can include an oxide, a nitride, an oxynitride, or any combination thereof. The insulating layer 22 can have a thickness in a range of approximately 5 to approximately 100 nm.

Figure 3:
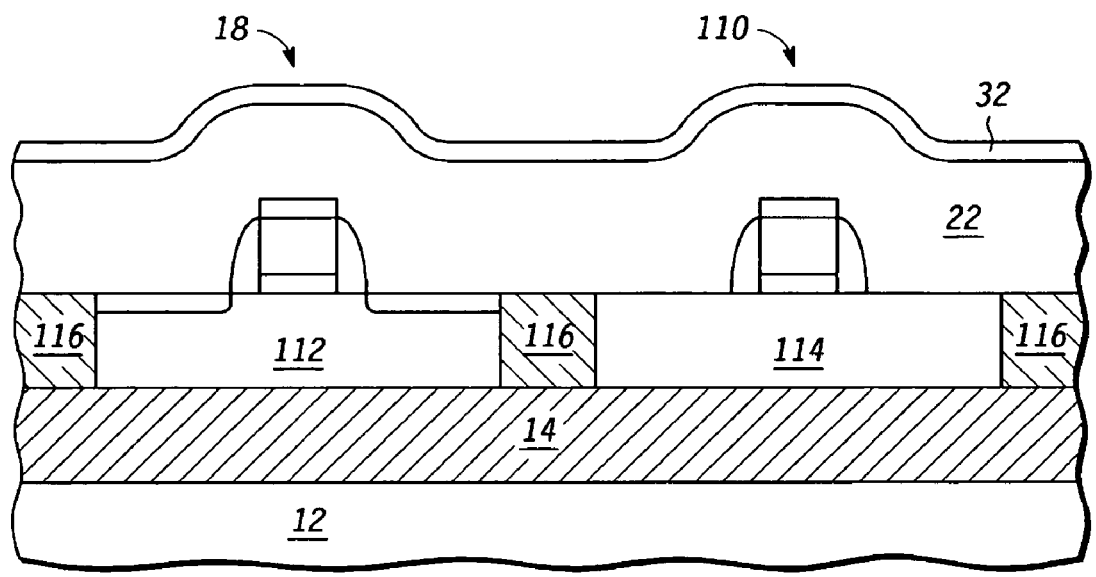
FIG. 3 includes an illustration of a cross-sectional view of the portion of the workpiece of FIG. 2 after forming a seed layer.

FIG. 3 includes an illustration of a cross-sectional view of the workpiece 10 after forming a seed layer 32. The seed layer 32 can be grown, deposited, or otherwise formed over the insulating layer 22 using a conventional or proprietary process. The seed layer 32 can include a semiconductor material, such as silicon, germanium, carbon, a compound semiconductor material, or any combination thereof. The seed layer 32 can have an amorphous or polycrystalline structure as deposited. In a particular embodiment, the seed layer can be recrystallized to have larger grains or a monocrystalline structure. The seed layer 32 can have a thickness in a range of approximately 0.5 to approximately 10 nm.

The seed layer 32 can be patterned to affect a subsequent process designed to selectively form a semiconductor material. Before patterning the seed layer 32, a mask may need to be designed to be used in forming a subsequent patterned layer (e.g., a patterned photoresist layer, a patterned deep ultraviolet resist layer, etc.), which is turn is used to pattern the seed layer 32. The pattern of the mask can be determined by where the seed layer 32 is designed to be present during a subsequent selective deposition.

More particularly, after patterning the seed layer 32, the amount and location of remaining portions of the seed layer 32 can be tailored so that the amount of a subsequently selectively deposited semiconductor material in locations where it is needed or otherwise used in electronic components within the electronic devices (e.g., selective deposition of a semiconductor material on exposed active regions) is more uniform within an electronic device, between different electronic devices on the same substrate, or even between different electronic devices fabricated using different mask sets. The remaining portion of the seed layer 32 can be designed so that substantially the same amount of material is selectively deposited regardless of feature density.

In a particular embodiment, portions of the seed layer 32 remain at all locations over the base layer 12 except at locations where a subsequent selective deposition onto active regions will occur. In another particular embodiment, the highest density of exposed active regions for all electronic devices may be approximately the same as a density of a combination of exposed active regions and remaining portions of the seed layer 32 in areas having a relatively low density of exposed active regions. In still another embodiment, the a density of a combination of exposed active regions and remaining portions of the seed layer 32 do not have to the same as the highest density of active regions but could be between the highest and lowest density of active regions. After reading this specification, skilled artisans will be able to determine the pattern for a mask used in removing portions of the seed layer 32.

Figure 4:
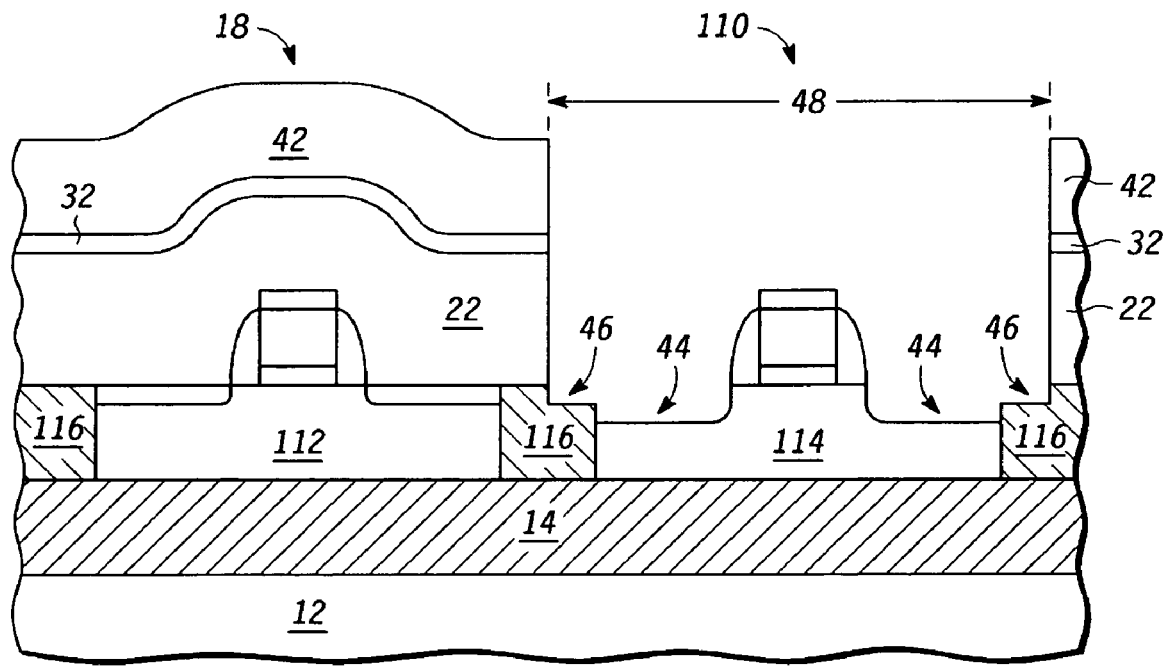
FIG. 4 includes an illustration of a cross-sectional view of the portion of the workpiece of FIG. 3 after exposing an active region.

FIG. 4 includes an illustration of a cross-sectional view of the workpiece 10 after removing a portion of the insulating layer 22 to expose the active region 114. A conventional or proprietary lithographic process can be used to form a patterned layer 42 that includes an opening 48 over the active region 114. The seed layer 32 and the insulating layer 22 within the opening 48 can be removed. The active region 114 and a portion of the field isolation region 116 can lie exposed within the opening 48. In one embodiment, a surface portion of the field isolation region 116 can be removed during removing the insulating layer 22 such that a surface 46 of the field isolation region 116 adjacent to the active region 114 can be lower in elevation than the surface of the field isolation region 116 adjacent to the active region 112. In a particular embodiment, the selectivity of the removal of the insulating layer 22 relative to the field isolation region 116 can be adjusted such that the surface 46 can be approximately placed at a predetermined elevation. A conventional or proprietary process may or may not be used to remove an exposed portion of the active region 114 to form a surface 44 of the active region 114, which is recessed. In one embodiment, the exposed portion of the active region 114 can be etched selectively with respect to the other materials exposed within the opening in the insulating layer 22. For example, the active regions 114 can include silicon, and other parts of the transistor structure 110 can have a spacer structure including silicon dioxide, and a cap including a silicon nitride or metal-silicide. The remaining portion of the patterned layer 42 can then be removed from the workpiece 10.

Figure 5:
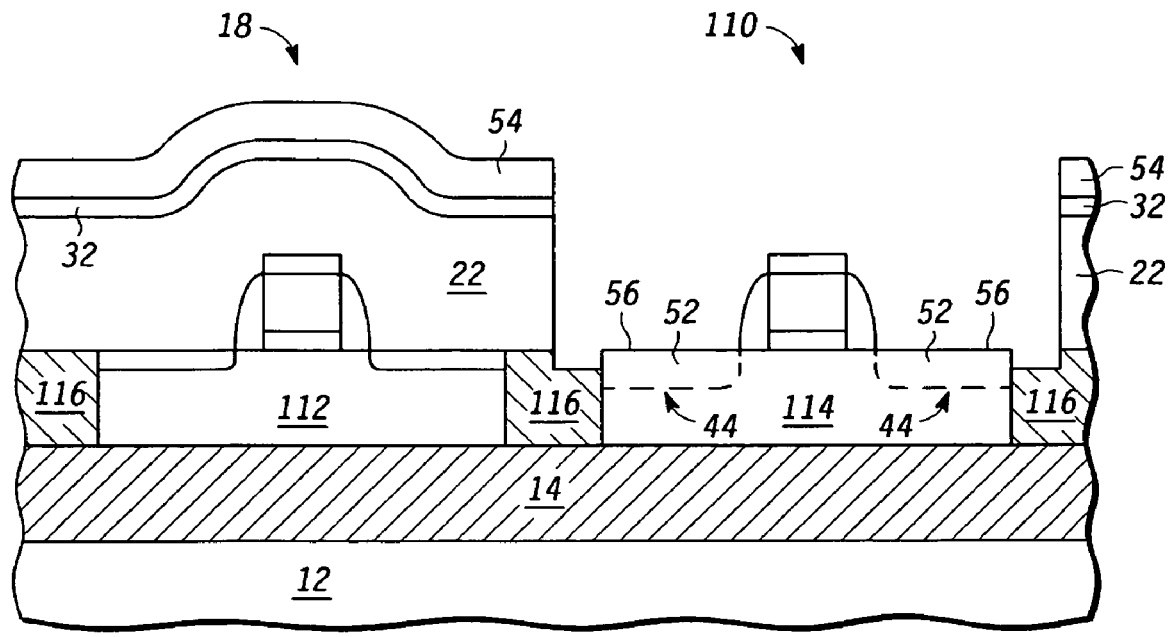
FIG. 5 includes an illustration of a cross-sectional view of the portion of the workpiece of FIG. 4 after forming a first semiconductor layer and a second semiconductor layer.

FIG. 5 includes an illustration of a cross-sectional view of the workpiece 10 after selectively forming a semiconductor layer 52 and a semiconductor layer 54. Some or all of the semiconductor layer 52 can serve as a portion of a subsequently formed source/drain region for the transistor structure 110. The semiconductor layer 52 can be selectively deposited, grown, or otherwise formed over the active region 114 using a conventional or proprietary process. The semiconductor layer 52 can have a thickness in a range of approximately 10 to approximately 200 nm. A top surface 56 of the semiconductor layer 52 can lie at, above, or below an original surface of the active region 114. In one embodiment, the semiconductor layer 52 can be epitaxially grown. In a particular embodiment, the semiconductor layer 52 can be epitaxially grown to substantially replace the semiconductor material previously removed from the surface 44. The semiconductor layer 52 can include a semiconductor material as previously described for the semiconductor layer 16. The semiconductor layer 52 can include a semiconductor material different from or the same as the semiconductor layer 16. For example, the semiconductor layer 16 can include monocrystalline silicon, and the semiconductor layer 52 can include silicon germanium. The semiconductor layer 52 may include the same or a different dopant at the same or a different concentration as the semiconductor layer 16. In one embodiment, the semiconductor layer 52 can have a substantially monocrystalline structure.

The semiconductor layer 54 can be formed over the seed layer 32 and be spaced-apart from the semiconductor layer 52. The semiconductor layer 54 can be a dummy layer and be formed primarily to affect the formation of the semiconductor layer 52. A conventional or proprietary process previously described for the semiconductor layer 52 can be used to form the semiconductor layer 54. The semiconductor layer 54 can be a same or different material, have a same or different semiconductor composition, and have a same or different structure as the semiconductor layer 52. The semiconductor layer 54 can have a thickness in a range as previously described with respect to the semiconductor layer 52. In one embodiment, the semiconductor layer 54 can have a different semiconductor composition than the active region 114. In a particular embodiment, the semiconductor layer 52 and the semiconductor layer 54 can be formed simultaneously at a substantially same point in time. In another particular embodiment, the semiconductor layer 52 can have substantially monocrystalline structure and the semiconductor layer 54 can have a substantially polycrystalline structure.

Figure 6:
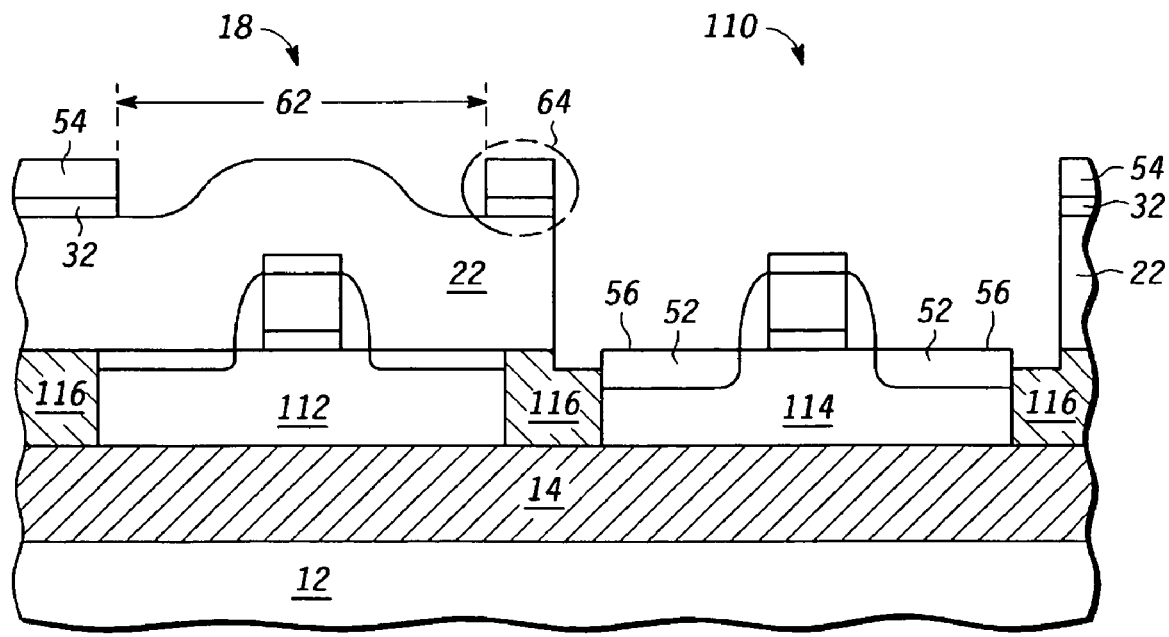
FIG. 6 includes an illustration of a cross-sectional view of the portion of the workpiece of FIG. 5 after removing a portion of the second semiconductor layer.

FIG. 6 includes an illustration of a cross-sectional view of the workpiece 10 after exposing the insulating layer 22 by removing the semiconductor layer 54 over the active region 112 using a conventional or proprietary process. In one embodiment, the semiconductor layer 54 can be selectively etched with respect to the semiconductor layer 52 and other exposed portions of the workpiece 10. In another embodiment, a patterned lithographic layer can be used to protect portions of the workpiece 10 during the etch process. In a particular embodiment, a semiconductor island 64 that is designed to be electrically floating when the electronic device would be used can include a remaining portion of the semiconductor layer 54. The semiconductor island 64 can be formed such that the semiconductor island 64 does not interfere with a subsequently formed conductive member. In such a case, the semiconductor island 64 can remain without substantially affecting the subsequent processing of the workpiece. Although not illustrated, in another embodiment, substantially all of the semiconductor layer 54 can be removed from the workpiece 10. In still another embodiment, the substantially all the remaining portion of the insulating layer 22 can be removed from the workpiece 10.

Figure 7:
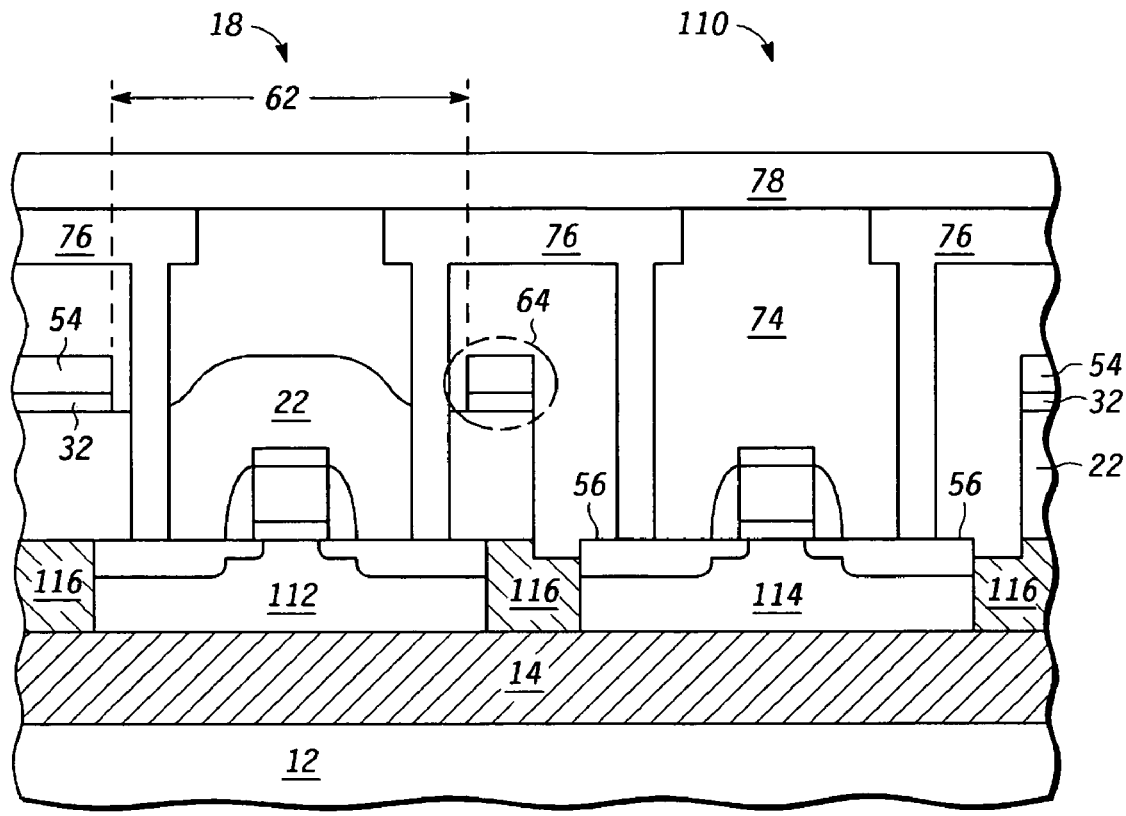
FIG. 7 includes an illustration of a cross-sectional view of the portion of the workpiece of FIG. 6 after substantial completion of an electronic device.

FIG. 7 includes an illustration of a cross-sectional view of a substantially completed electronic device. In one embodiment, the transistor structure 18 can have an associated channel region of one conductivity type and the transistor structure 110 can have an associated a channel region of the opposite conductivity type. Additional dopant can be introduced and activated to form a source/drain region of the electronic device. An insulating layer 74, a conductive member 76, and an encapsulating layer 78 are formed using a conventional or proprietary technique. In one embodiment, a conductive member 76 can extend through the opening 62 in the semiconductor layer 54 and be electrically insulated from the semiconductor layer 54. In another embodiment, the semiconductor island 64 can lie between the base layer 12 and the conductive member 76. The conductive member 76 can electrically connect the transistor structure 18 to the transistor structure 110. Although illustrated as planar device structures, skilled artisans will appreciate that fin-type structures, or a mixture of fin-type and planar structures can also be formed in place of the transistor structure 18, the transistor structure 110, or any combination thereof. Skilled artisans can also appreciate that each of the transistor structure 18 and the transistor structure 110 can be either an n-channel transistor or a p-channel transistor. In a particular embodiment, the transistor structure 18 can be an n-channel transistor, and the transistor structure 110 can be a p-channel transistor.

Figure 8:
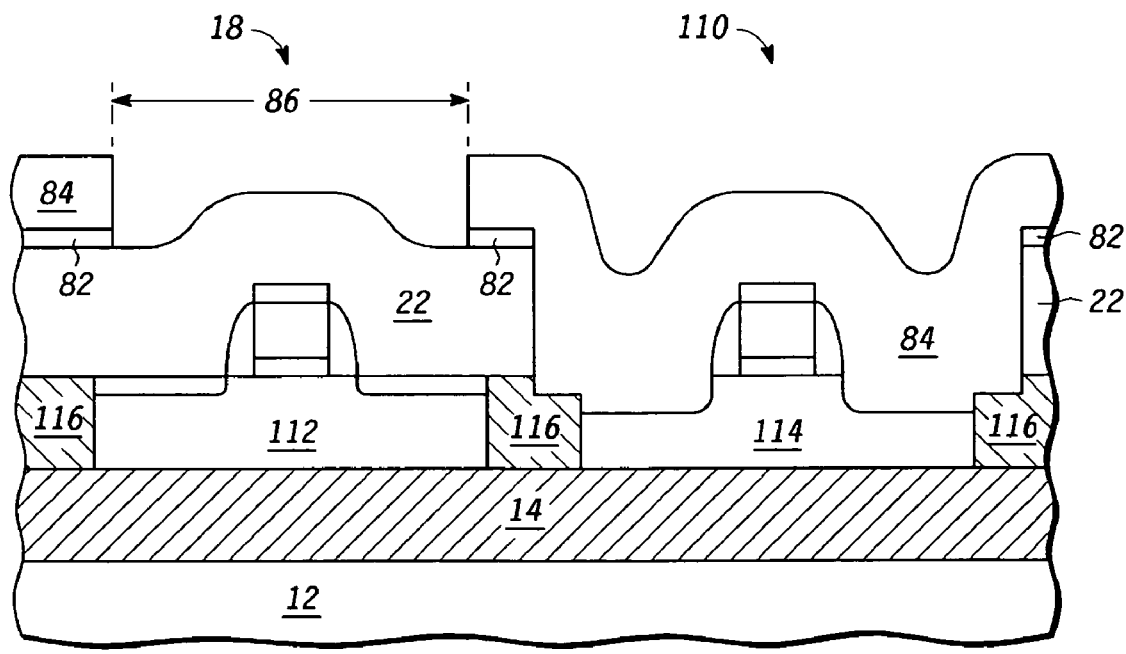
FIG. 8 includes an illustration of a cross-sectional view of the portion of the workpiece of FIG. 3 after removing at least a portion of the seed layer according to an alternative embodiment.

In an alternative embodiment, the seed layer 32 can be patterned to include an opening prior to depositing the semiconductor layer 52. By using a selective process to form the semiconductor layer 52, the semiconductor layer 54 can include an opening without requiring a subsequent etch process. FIG. 8 includes an illustration of a workpiece 80 including a seed layer 82. In one embodiment, after removing the patterned layer 42, as previously described with respect to the workpiece 10 in FIG. 4, another patterned layer 84 can be formed over the workpiece 80. The patterned layer 84 can have an opening 86 over the active region 112. An exposed portion of the seed layer 32 can be removed to form the seed layer 82. The patterned layer 84 can be removed from the workpiece 80. In one embodiment, the semiconductor layer 54 can be formed selectively, such that the structure illustrated in FIG. 6, including the semiconductor island 64, can be formed directly without the need of the previously described patterning and etch step. Processing of the workpiece 80 can continue as previously described to form a substantially complete electronic device.

In another alternative embodiment, the electronic device can be formed substituting a monocrystalline semiconductor substrate for the combination of the base layer 12, the insulating layer 14, and the semiconductor layer 16. For the purposes of this embodiment, the monocrystalline semiconductor substrate is a semiconductor layer. Referring to FIG. 1, the active region 112 and the active region 114 are the surface portions of the monocrystalline semiconductor substrate. The field isolation region 116 can lie between the active region 112 and the active region 114 and extend only partially into the monocrystalline semiconductor substrate. After the field isolation region 116 is formed and defines the active region 112 and the active region 114, the transistor structure 18 and the transistor structure 110 can be formed by an embodiment as previously described for the FIG. 1. The processing technique previously described can be used to form a substantially complete electronic device.

Embodiments as described herein can provide benefits to electronic devices formed using the processes as described herein. Selective formation of a semiconductor layer with an opening in a protective layer can be affected by the presence of a seed layer over areas covered by the protective layer. Adjusting the amount of seed layer present can help compensate for pattern density sensitivity typically present in a selective process. By compensating for pattern density differences between mask sets, a process can be used successfully on a wider range of products without adjustment. In one embodiment, a portion of the seed layer can be removed such that the structure formed does not substantially interfere with subsequent formation of the electronic device.

In another embodiment, an adjacent stressed layer can be used to affect the mobility of carriers in the channel. The removed portion of the field isolation region adjacent to the active region, as illustrated with respect to the formation of surface 46 of FIG. 4, can be replaced with the stressed layer. Changing the amount of stressed material and the location of the stressed material relative to the active region can change the stress affect within the associated channel region. For example, a tensile portion of the insulating layer 74 of FIG. 7 below the surface of the active region 114 could be more effective in applying stress within the channel than if tensile portion was at or above the surface of the active region 114.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a process of forming an electronic device can include forming a first insulating layer over a first active region, a second active region, and a field isolation region. The field isolation region can lie between the first active region and the second active region. The process can also include forming a seed layer over the first insulating layer and exposing the first active region. The process can further include selectively forming a first semiconductor layer over the first active region. The process can still further include selectively forming a second semiconductor layer over the seed layer, the second semiconductor layer spaced-apart from the first semiconductor layer.

In one embodiment of the first aspect, selectively forming the first semiconductor layer and selectively forming the second semiconductor layer occur simultaneously at a substantially same point in time. In another embodiment, the process can further include removing a portion of the second semiconductor layer. In yet another embodiment, the process can further include removing a portion of the seed layer to expose a portion of the insulating layer before selectively forming the second semiconductor layer.

In another embodiment of the first aspect, forming the seed layer includes forming the seed layer including a semiconductor material. In still another embodiment, forming the first semiconductor layer includes forming the first semiconductor layer having a first semiconductor composition, and forming the second semiconductor layer includes forming the second semiconductor layer having the first semiconductor composition. In a more particular embodiment, forming the first semiconductor layer includes forming the first semiconductor layer including a substantially monocrystalline structure, and forming the second semiconductor layer includes forming the second semiconductor layer including substantially polycrystalline structure.

In a still more particular embodiment of the first aspect, the process can further include selectively removing the second semiconductor layer with respect to the first semiconductor layer. In a more particular embodiment, the process can further include removing the first insulating layer wherein during removing the first insulating layer, an exposed portion of the field isolation region immediately adjacent to the first semiconductor layer is also removed. In a particular embodiment, the first active region includes a different semiconductor composition from the first semiconductor composition.

In another particular embodiment of the first aspect, the process can further include forming a first transistor structure lying within the first active region, wherein the first transistor structure has an associated first channel region of a first conductivity type. The process can also include forming a second transistor structure lying within the second active region, wherein the second transistor structure has an associated second channel region of a second conductivity type. The first conductivity type can be different from the second conductivity type. In a more particular embodiment, the first conductivity type is n-type.

In another embodiment of the first aspect, the process can further include forming an opening through the second semiconductor layer. The process can also include forming a conductive member within the opening through the second semiconductor layer such that the conductive member is electrically insulated from the second semiconductor layer. In still another embodiment, the process can also include providing a substrate wherein the substrate includes a base layer, a third semiconductor layer, and a second insulating layer lying between the base layer and the third semiconductor layer. The process can further include forming the first active region and the second active region. Each of the first active region and the second active region can include a portion of the third semiconductor layer. The process can still further include forming the field isolation region lying between the first active region and the second active region.

In a second aspect, a process of forming an electronic device can include providing a substrate. The substrate can include a first semiconductor layer. The process can also include forming a first active region and a second active region. Each of the first active region and the second active region can include a portion of the first semiconductor layer. The process can further include forming a field isolation region lying between the first active region and the second active region. The process can still further include forming a second insulating layer over the first active region, the second active region, and the field isolation region. The process can yet further include forming a seed layer over the second insulating layer, wherein the seed layer includes a semiconductor material. The process can also include exposing the first active region. The process can further include selectively forming a second semiconductor layer over an exposed portion of the first active region. The process can yet further include selectively forming a third semiconductor layer over an exposed portion of the seed layer. The third semiconductor layer can be spaced-apart from the second semiconductor layer. Selectively forming the third semiconductor layer can be performed simultaneously at a substantially same point in time as selectively forming the second semiconductor layer. The process can also include forming an opening through the third semiconductor layer. The process can further include forming a conductive member within the opening through the third semiconductor layer such that the conductive member is electrically connected to the second active region and is electrically insulated from the second semiconductor layer.

In one embodiment of the second aspect, a p-channel transistor structure includes the first active region, and an n-channel transistor structure includes the second active region.

In a third aspect, an electronic device can include a first transistor structure including a first source/drain region having a first semiconductor material. The electronic device can also include a second transistor structure including a second source/drain region having a second semiconductor material. The electronic device can further include a field isolation region lying between the first transistor structure and the second transistor structure. The electronic device can still further include a conductive member electrically connected to the first transistor structure, the second transistor structure, or any combination thereof. The electronic device can yet further include a semiconductor island lying between the conductive member and a base layer of the electronic device and having the first semiconductor composition. The semiconductor island can be designed to electrically float when the electronic device would be used.

In one embodiment of the third aspect, the first transistor structure further includes a first channel region having a first dopant type. The second transistor structure further includes a second channel region having a second dopant type opposite the first dopant type. In a more particular embodiment, the dopant in the first channel region includes arsenic, phosphorus, or any combination thereof. In still another embodiment, a portion of the semiconductor island lies within the field isolation region.

To the extent not described herein, many details regarding specific materials, processing acts, and circuits are conventional and may be found in textbooks and other sources within the semiconductor and microelectronic arts. Other features and advantages of the invention will be apparent from the following detailed description, and from the claims.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining which one or more activities or one or more portions thereof are used or not used and the order of such activities are to be performed for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process of forming an electronic device comprising:
    forming a first insulating layer over a first active region, a second active region, and a field isolation region, the field isolation region lying between the first active region and the second active region;
    forming a seed layer over the first insulating layer and spaced-apart from the second active region, wherein:
        the seed layer includes a first portion and a second portion:
        the first portion overlies the first active region; and
        the second portion overlies the field isolation region;
    removing the first portion of the seed layer to define an opening, wherein the second portion remains over the field isolation region;
    exposing the second active region;
    selectively forming a first semiconductor layer over the seed layer; and
    selectively forming a second semiconductor layer over the second active region.

2. The process of claim 1, wherein selectively forming the first semiconductor layer and selectively forming the second semiconductor layer occur simultaneously at a substantially same point in time.

3. The process of claim 1 further comprising removing a portion of the first semiconductor layer.

4. The process of claim 1, wherein removing the first portion of the seed layer performed after selectively forming the first semiconductor layer and before selectively forming the second semiconductor layer.

5. The process of claim 1, wherein forming the seed layer comprises forming the seed layer including a semiconductor material.

6. The process of claim 1, wherein:
forming the first semiconductor layer comprises forming the first semiconductor layer having a first semiconductor composition; and
forming the second semiconductor layer comprises forming the second semiconductor layer having the first semiconductor composition.

7. The process of claim 6, wherein:
forming the second semiconductor layer includes forming the second semiconductor layer comprising a substantially monocrystalline structure; and
forming the first semiconductor layer includes forming the first semiconductor layer comprising substantially polycrystalline structure.

8. The process of claim 7, further comprising selectively removing the first semiconductor layer with respect to the second semiconductor layer.

9. The process of claim 8, farther comprising removing the first insulating layer wherein during removing the first insulating layer, an exposed portion of the field isolation region immediately adjacent to the first semiconductor layer is also removed.

10. The process of claim 7, wherein the first active region comprises a different semiconductor composition from the first semiconductor composition.

11. The process of claim 1, further comprising:
forming a first transistor structure lying within the first active region, wherein the first transistor structure has an associated first channel region of a first conductivity type; and
forming a second transistor structure lying within the second active region, wherein the second transistor structure has an associated second channel region of a second conductivity type, wherein the first conductivity type is different from the second conductivity type.

12. The process of claim 1, further comprising removing a portion of the first semiconductor layer overlying the first active region before selectively forming the second semiconductor layer.

13. The process of claim 1, further comprising
forming a second insulating layer over the first active region, the second active region, the field isolation region, the second portion of the seed layer, and within the opening of the seed layer; and
forming a first conductive member and a second conductive member, wherein:
the first conductive member overlying the first active region; extends through the first insulating layer, the second insulation layer, and the opening of the seed layer; is spaced apart from the seed layer and the first semiconductor; and is electrically connected to the first active region; and
the second conductive member overlying the second active region; extends through the second insulating layer; is spaced apart from the first semiconductor layer; and is electrically connected to the second semiconductor layer.

14. The process of claim 1 further comprising:
providing a substrate wherein the substrate includes:
a base layer;
a third semiconductor layer; and
a third insulating layer lying between the base layer and the third semiconductor layer; and forming the field isolation region between the first active region and the second active region, wherein the field isolation region abuts the third insulating layer, and each of the first active region and the second active region comprises a portion of the third semiconductor layer.

15. The process of claim 1, wherein removing the first portion of the seed layer is performed before selectively forming the first semiconductor layer and before selectively forming the semiconductor layer.

16. The process of claim 1, wherein:
forming the seed layer comprises forming the seed layer including a semiconductor material;
forming the first semiconductor layer comprises forming the first semiconductor layer having a first semiconductor composition with a substantially polycrystalline structure; and
forming the second semiconductor layer comprises forming the second semiconductor layer having the first semiconductor composition with a substantially monocrystalline structure.

17. The process of claim 16, further comprising:
selectively removing the first semiconductor layer with respect to the second semiconductor layer; and
removing the first insulating layer wherein during removing the first insulating layer, an exposed portion of the field isolation region immediately adjacent to the second active region is also removed.

18. The process of claim 1, further comprising:
forming a first transistor structure lying within the first active region, wherein the first transistor structure is an n-channel transistor structure; and
forming a second transistor structure lying within the second active region, wherein the second transistor structure is a p-channel transistor structure.

19. A process of forming an electronic device comprising:
providing a substrate wherein the substrate includes a first semiconductor layer;
forming a first active region, a second active region, and a field isolation region, wherein the field isolation region lies between the first active region and the second active region, and each of the first active region and the second active region comprises a portion of the first semiconductor layer;
forming a first insulating layer over the first active region, the second active region, and the field isolation region;
forming a seed layer over the first insulating layer and spaced apart from the second active region, wherein the seed layer comprises a semiconductor material;
removing a portion of the seed layer to define an opening, wherein a remaining portion of the seed layer remains over the first insulating layer;
exposing the second active region after forming the seed layer;
selectively forming a second semiconductor layer over an the remaining portion of the seed layer after removing the portion of the seed layer;
selectively forming a third semiconductor layer over an exposed portion of the second active region after removing the portion of the seed layer;
the third semiconductor layer is spaced-apart from the second semiconductor layer; and selectively forming the third semiconductor layer is performed simultaneously at a substantially same point in time as selectively forming the second semiconductor layer; and forming a conductive member extending through the opening of the seed layer such that the conductive member is electrically connected to the first active region and is electrically insulated from the second semiconductor layer and the remaining portion the seed layer.

20. The process of claim 19, wherein:

a p-channel transistor structure comprises the second active region; and an n-channel transistor structure comprises the first active region.

* * * * *

UNITED STATES PATENT AND TRADEMARK OFFICE
CERTIFICATE OF CORRECTION

| | | |
|---|---|---|
| PATENT NO. | : 7,514,313 B2 | Page 1 of 1 |
| APPLICATION NO. | : 11/400945 | |
| DATED | : April 7, 2009 | |
| INVENTOR(S) | : Omar Zia et al. | |

It is certified that error appears in the above-identified patent and that said Letters Patent is hereby corrected as shown below:

Column 10, Line 46, Please change "portion:" to --portion;--.

Column 10, Line 65, Please change "Layer performed" to --layer is performed--.

Column 11, Line 21, Please change "farther" to --further--.

Column 11, Line 55, Please change "semiconductor;" to --semiconductor layer--.

Column 12, Line 60, Please change "over an the" to --over the--.

Signed and Sealed this

First Day of June, 2010

David J. Kappos
*Director of the United States Patent and Trademark Office*